US010622190B2

(12) United States Patent
Marakhtanov et al.

(10) Patent No.: US 10,622,190 B2
(45) Date of Patent: Apr. 14, 2020

(54) SYSTEMS AND METHODS FOR CONTROLLING A PLASMA EDGE REGION

(71) Applicant: Lam Research Corporation, Fremont, CA (US)

(72) Inventors: Alexei Marakhtanov, Albany, CA (US); Rajinder Dhindsa, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 402 days.

(21) Appl. No.: 15/192,397

(22) Filed: Jun. 24, 2016

(65) Prior Publication Data

US 2016/0307737 A1    Oct. 20, 2016

Related U.S. Application Data

(62) Division of application No. 13/310,673, filed on Dec. 2, 2011, now Pat. No. 9,396,908.

(60) Provisional application No. 61/563,021, filed on Nov. 22, 2011.

(51) Int. Cl.
*H01J 37/32* (2006.01)
*H05B 7/18* (2006.01)

(52) U.S. Cl.
CPC .. *H01J 37/32183* (2013.01); *H01J 37/32091* (2013.01); *H01J 37/32174* (2013.01); *H01J 37/32568* (2013.01); *H01J 37/32577* (2013.01); *H05B 7/18* (2013.01)

(58) Field of Classification Search
CPC ............ H05B 7/18; H01J 37/32091; H01J 37/32183; H01J 37/32174; H01J 37/32577; H01J 37/32568
See application file for complete search history.

(56) References Cited

U.S. PATENT DOCUMENTS

| 6,262,538 | B1 | 7/2001 | Keller | |
|---|---|---|---|---|
| 7,572,737 | B1* | 8/2009 | Dhindsa | H01J 37/32623 216/68 |
| 8,252,140 | B2 | 8/2012 | Sexton et al. | |
| 8,574,397 | B2 | 11/2013 | Sexton et al. | |
| 9,852,889 | B1 | 12/2017 | Kellogg et al. | |
| 2003/0032301 | A1* | 2/2003 | Dhindsa | C23C 16/45565 438/758 |
| 2005/0039682 | A1 | 2/2005 | Dhindsa et al. | |
| 2005/0241766 | A1* | 11/2005 | Dhindsa | H01J 37/32009 156/345.34 |
| 2007/0186855 | A1 | 8/2007 | Dhindsa | |
| 2008/0160776 | A1 | 7/2008 | Dhindsa et al. | |

(Continued)

FOREIGN PATENT DOCUMENTS

| JP | H0521156 A | | 1/1993 |
|---|---|---|---|
| JP | 10012597 A | * | 1/1998 |

(Continued)

*Primary Examiner* — Yuechuan Yu
(74) *Attorney, Agent, or Firm* — Penilla IP, APC

(57) ABSTRACT

Systems and methods for controlling a plasma edge region are described. One of the systems includes a top electrode and a bottom electrode. The system also includes an upper electrode extension and a lower electrode extension. At least a portion of the plasma edge region is formed between the upper electrode extension and the lower electrode extension. The system includes a circuit to control a radio frequency signal at the upper electrode extension.

19 Claims, 10 Drawing Sheets

(56) References Cited

U.S. PATENT DOCUMENTS

| | | | |
|---|---|---|---|
| 2009/0230089 A1* | 9/2009 | Bera | H01J 37/32009 216/67 |
| 2010/0018648 A1 | 1/2010 | Collins et al. | |
| 2010/0243609 A1 | 9/2010 | Yamazawa et al. | |
| 2010/0252199 A1* | 10/2010 | Marakhtanov | H01J 37/32091 156/345.48 |
| 2011/0201208 A1* | 8/2011 | Kawakami | H01L 21/31116 438/714 |
| 2011/0253672 A1 | 10/2011 | Kamibayashi et al. | |
| 2013/0127124 A1 | 5/2013 | Nam et al. | |
| 2013/0128409 A1 | 5/2013 | Nam et al. | |
| 2016/0145742 A1 | 5/2016 | Janakiraman et al. | |

FOREIGN PATENT DOCUMENTS

| | | | |
|---|---|---|---|
| JP | 2003115400 A | * | 4/2003 |
| JP | 2006-275543 A | | 10/2006 |

\* cited by examiner

FIG. 1A

SYSTEMS AND METHODS FOR CONTROLLING A PLASMA EDGE REGION

CLAIM OF PRIORITY

This patent application is a divisional of and claims the benefit of and priority, under 35 U.S.C. § 120, to U.S. patent application Ser. No. 13/310,673, filed on Dec. 2, 2011, and titled "Systems and Methods for Controlling a Plasma Edge Region", which claims priority to and benefit of, under 35 U.S.C. § 119(e), to a provisional patent application having Application No. 61/563,021, filed on Nov. 22, 2011, and titled "Systems and Methods for Controlling a Plasma Edge Region", both of which are incorporated by reference herein in their entirety for all purposes.

TECHNICAL FIELD

The various embodiments described herein relate to systems and methods for controlling a plasma edge region.

BACKGROUND ART

It is known to apply plasma excitation fields to a region of a vacuum chamber for plasma processing a workpiece. Typically, the plasma excitation fields are supplied to the region by the pair of top and bottom electrodes in the chamber or one electrode in the chamber and a coil, located outside the chamber. A process region is formed between the top electrode and the bottom electrode. The process region is coupled to a gas that the fields convert into the processing plasma. The workpiece is usually a semiconductor wafer, or dielectric plate and the plasma is involved in forming integrated circuit features on the workpiece. The plasma in the vacuum chamber typically dry etches the workpiece, but in some instances results in materials being deposited on the workpiece.

As the size of workpiece continues to increase and as the size of the process region continues to increase, there are increased requirements for precise control of various parameters of the plasma processing the workpiece.

It is in this context that various embodiments of the present disclosure arise.

SUMMARY

As a size of a workpiece and/or a process region within a plasma chamber of a plasma generating system increases, it becomes important to control plasma at a plasma edge region. In one embodiment, the plasma edge region is formed between an upper electrode extension of the plasma generating apparatus and a lower electrode extension of the plasma generating apparatus. Such control of the plasma in the plasma edge region is achieved by controlling a voltage amplitude of an RF signal that is applied to the plasma edge region. A density of the plasma within the plasma edge region is controlled with the control of the voltage amplitude of the RF signal.

In one embodiment, a system for controlling a plasma edge region is described. The system includes a top electrode for generating an electric field and a bottom electrode for generating the electric field. The system further includes one or more upper insulating rings surrounding a portion of the top electrode and a lower insulating ring surrounding a portion of the bottom electrode. The system also includes an upper electrode extension surrounding a portion of the one or more upper insulating rings and a lower electrode extension surrounding a portion of the lower insulating ring. At least a portion of a plasma center region is formed between the top electrode and the bottom electrode. Moreover, at least a portion of the plasma edge region is formed between the upper electrode extension and the lower electrode extension. The system further includes a control circuit for generating a first radio frequency signal that is applied to the upper electrode extension. In some embodiments, the plasma edge region is located outside a circumference of a workpiece, a portion of which is in the plasma center region.

In some embodiments, the top electrode is coupled with ground when the upper electrode extension is coupled with a passive component of the control circuit. Moreover, the top electrode is coupled with an active component of the control circuit when the upper electrode extension is coupled with the active component or another active component of the control circuit.

In another embodiment, a system for controlling a plasma edge region is described. The system includes a control circuit for generating a first radio frequency signal to apply to an upper electrode extension. The upper electrode extension is other than a top electrode of a plasma chamber. The plasma edge region is formed between the upper electrode extension and a lower electrode extension of the plasma chamber.

In various embodiments, the control circuit includes an active component or a passive component. The passive component is coupled with the upper electrode extension when the top electrode is coupled with ground. Moreover, the active component is coupled with the top electrode when the same or a different active component is coupled with the upper electrode extension.

In some embodiments, a method for controlling a plasma edge region is described. The method includes receiving a coupling with a plasma edge region via an upper electrode extension. The plasma edge region is located within a plasma region. The plasma edge region is located between an upper electrode extension and a lower electrode extension. The plasma region includes a plasma center region, which is formed between a top electrode and a bottom electrode. The method further includes generating a radio frequency signal and applying the radio frequency signal to the upper electrode extension. The application of the radio frequency signal includes applying the radio frequency signal generated from an active component when the top electrode receives power from the same or a different active component. Moreover, the application of the radio frequency signal includes applying the radio frequency signal that is controlled by a passive component when the top electrode is coupled with ground.

The advantages of the systems and various methods, described herein, will become apparent from the following drawings taken in conjunction with the accompanying detailed description.

BRIEF DESCRIPTION OF THE DRAWINGS

FIG. 1A is a view of a portion of a system for generating plasma, in accordance with one embodiment of the present invention.

DETAILED DESCRIPTION

In the following description, numerous specific details are set forth in order to provide a thorough understanding of various embodiments of the present invention. However, it will be apparent to one skilled in the art that some embodiments of the present invention may be practiced without some of these specific details. In other instances, known process operations and implementation details have not been described in detail in order to avoid unnecessarily obscuring embodiments of the present invention.

Figure 1A:
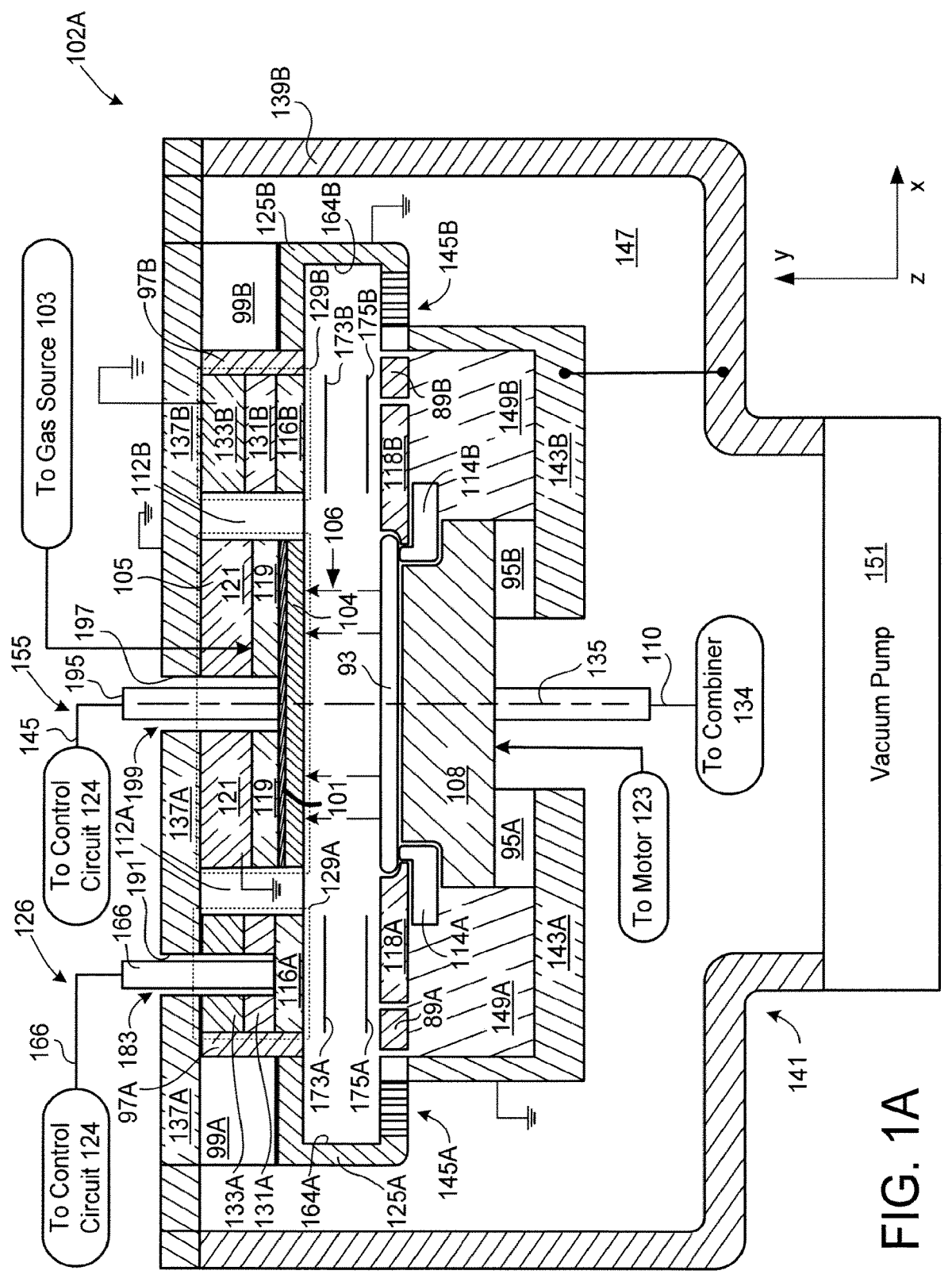
Figure 1B:
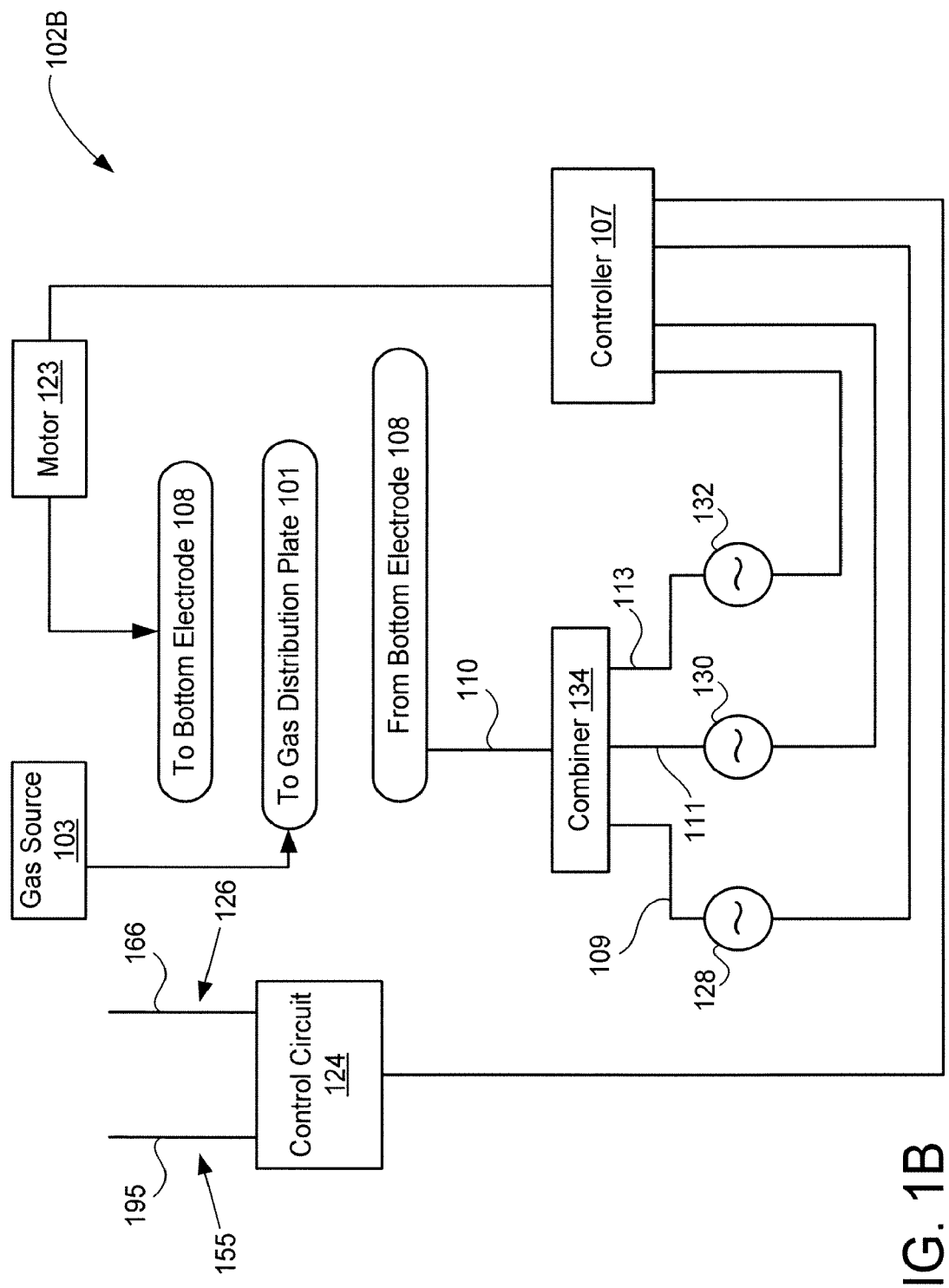
FIG. 1B is a view of the remaining portion of the system of FIG. 1, in accordance with one embodiment of the present invention.

FIG. 1A is a view an embodiment of a portion of a system 102 for generating plasma and FIG. 1B is a view of an embodiment of the remaining portion of the system 102. As shown in FIG. 1B, a gas source 103 includes one or more gases that flow through one or more openings within a top electrode assembly 105 (see FIG. 1A) into a plasma region that includes a plasma center region and a plasma edge region. In one embodiment, inner walls 164 of a C-shroud 125 form an edge of the plasma region to confine plasma within the plasma region. The C-shroud 125 is made of a semiconductor and is electrically grounded. Examples of gas include hydrogen gas, nitrogen gas, oxygen gas, ammonia gas, nitrogen trifluoride gas, and ammonium fluoride gas. It should be noted that 'grounded' or 'coupled with a ground voltage' are used interchangeably herein. Moreover, a ground voltage is either a zero voltage or a reference non-zero voltage. Also, in some embodiments, "coupled with" means electrically coupled with.

The top electrode assembly 105 includes a gas distribution plate 101, a top electrode 104, a first layer 119 and a second layer 121. In various embodiments, the first layer 119 is a dielectric layer, such as a layer fabricated from aluminum nitride or another dielectric material. The first layer 119 is located between the gas distribution plate 101 and the second layer 121. In some embodiments, the top electrode assembly 105 includes any number of layers. In one embodiment, the top electrode assembly 105 excludes the second layer 121. In one embodiment, the top electrode 104 is made of a semiconductor, such as a silicon or silicon carbide. In one embodiment, the second layer 121 is a heater, made of a metal, that heats the top electrode 104 via the first layer 119 and the gas distribution plate 101 by applying conduction. In some embodiments, the second layer 121 receives alternating current (AC) from an AC power source (not shown) or direct current (DC) from a DC power source (not shown) to generate heat. Moreover, the second layer 121 is grounded to provide to control temperature of the top electrode 104. Various embodiments of a heater and a gas distribution plate are described in U.S. Pat. No. 7,712,434, which is incorporated by reference herein in its entirety.

A workpiece 93, such as a wafer substrate, is placed on top of a bottom electrode 108. In one embodiment, the workpiece 93 has a diameter greater than that of the bottom electrode 108. In some embodiments, the workpiece 93 has a diameter less than or equal to that of the bottom electrode 108. In one embodiment, the workpiece 93 includes a dielectric layer coated on a wafer substrate and a portion of the dielectric layer is etched away by plasma. In some embodiments, a layer of material is deposited on the workpiece 93 with the plasma. In various embodiments, the workpiece 93 includes a wafer and one or more microelectronic devices built in and/or over the wafer.

Referring to FIG. 1B, a controller 107 controls one or more radio frequency (RF) sources 128, 130 and 132 to send one or more RF signals to a combiner 134. As used herein, a controller is a combination of a processor and a memory device. A processor, in some embodiments, is a microprocessor, a central processing unit (CPU), an application specific integrated circuit (ASIC), or a programmable logic device (PLD). A memory device includes a read-only memory (ROM), a random access memory (RAM), or a combination thereof. It is noted that an RF signal is a voltage signal or a current signal. It should be noted that although three RF sources are shown in FIG. 1B, in some embodiments, any number of RF sources is used.

In one embodiment, the controller 107 sends a signal to an RF source to indicate a frequency and/or voltage amplitude of operation of the RF source. A frequency of operation of an RF source determines a frequency of a signal generated by the RF source and a voltage amplitude of operation of the RF source determines a voltage amplitude of the RF source. In some embodiments, an RF source is an RF oscillator.

With continued reference to FIG. 1B, the combiner 134 combines RF signals generated by one or more of RF sources 128, 130 and 132 to generate a combined RF signal 110. In one embodiment, the combiner 134 sums one or more of RF signals 109, 111 and 113 to generate the combined RF signal 110. Further discussion of the combiner 134 is provided in U.S. Patent Application Publication 2005/0264218, which is incorporated by reference herein in its entirety. The RF signal 109 is generated by the RF source 128, the RF signal 111 is generated by the RF source 130, and the RF signal 113 is generated by the RF source 132. In one embodiment, the RF signal 109 has a frequency of 2 megaHertz (MHz), the RF signal 111 has a frequency of 27 MHz, and the RF signal 113 has a frequency of 60 MHz. In some embodiments, the RF signal 109 has a frequency of approximately 2 MHz, the RF signal 111 has a frequency of approximately 27 MHz, and the RF signal 113 has a frequency of approximately 60 MHz.

The combined RF signal 110 is provided by the combiner 134 to the bottom electrode 108, which is shown in FIG. 1A. In some embodiments, another combined RF signal is provided by the combiner 134 to the top electrode 104 via the gas distribution plate 101. The other combined RF signal is a combination of one or more RF signals. In one embodiment, the top electrode 104 is coupled with a ground voltage.

The provision of the combined RF signal 110 to the bottom electrode 108 and either the ground voltage or the other combined RF signal to the top electrode 104 results in generation of an electric field 106 that is between the bottom electrode 108 and the top electrode 104.

Also, in one embodiment, as shown in FIG. 1B, the controller 107 sends a signal to drive a motor 123. Upon receiving the signal, the motor 123 operates to move the bottom electrode 108 to change a volume of the plasma center region. In some embodiments, at least a portion of the workpiece 93 is located within the plasma center region.

With reference to FIG. 1A, in some embodiments, one or more insulating rings 112 surround a portion, such as a periphery, of the top electrode assembly 105 to insulate the top electrode assembly 105 from an upper electrode extension assembly 129. In one embodiment, the upper electrode extension assembly 129 surrounds a portion, such as a periphery, of the one or more insulating rings 112.

The upper electrode extension assembly 129 includes an upper electrode extension 116, a first layer 131 and a second layer 133. In some embodiments, the upper electrode extension assembly 129 includes any number of layers. In one embodiment, the upper electrode extension 116 is made of a semiconductor. In some embodiments, the first layer 131 is made of a dielectric, such as quartz or aluminum nitride. In one embodiment, the second layer 133 is a heater that is coupled with an AC power source (not shown) or a DC power source (not shown) and grounded to control heat. The heat generated from the second layer 133 is provided to the upper electrode extension 116. In several embodiments, the upper electrode extension assembly 129 excludes the second layer 133.

In some embodiments, one or more insulating rings 97 surround a portion of the upper electrode extension assembly 129. In one embodiment, a metal layer 99 surrounds a portion of the one or more insulating rings 97. A metal layer 137 covers the one or more insulating rings 97A, the metal layer 99, the upper electrode assembly 129, the insulating ring 112, and the top electrode assembly 105. In some embodiments, the metal layer 137 is grounded.

Moreover, one or more RF coupling rings 114 surround a portion of the bottom electrode 108 to insulate the bottom electrode 108 from a lower electrode extension 118, which is made of a semiconductor. The one or more coupling rings 114 are made of an insulating material. In one embodiment, the lower electrode extension 118 surrounds a portion of the one or more RF coupling rings 114.

In some embodiments, the lower electrode extension 118 has a surface area facing the plasma edge region equal to or less than a surface area of the bottom electrode 108 to assist in having an appropriate amount of energy of ions incident from plasma on the workpiece 93. In this embodiment, the surface area of the bottom electrode 108 is an area of a surface that faces the plasma center region. In other embodiments, the lower electrode extension 118 has a surface area facing the plasma edge region greater than a surface area of the bottom electrode 108. In these embodiments, the surface area of the bottom electrode 108 is an area of a surface that faces the plasma center region.

A sidewall 139 of a plasma processing vacuum chamber 141 is a metal layer that is coated with a dielectric. For example, an inner surface of the side wall 139 is made of a dielectric and an outer surface of the side wall 139 is made of a metal. The inner surface of the side wall 139 faces towards a region 147 and the outer surface of the side wall 139 faces a direction opposite to that the inner surface.

In various embodiments, the plasma region is confined by the C-shroud 125, the one or more insulating rings 97, the upper electrode extension 116, the one or more insulating rings 112, the top electrode assembly 105, an insulating ring 89, the lower electrode extension 118, and the bottom electrode 108. In one embodiment, the insulating ring 89 covers a portion of an insulator 149, such as quartz. In one embodiment, the lower electrode extension 118 receives power from the bottom electrode 108 via one or more coupling rings 114.

A portion of the plasma within the plasma edge region has a top sheath 173 and a bottom sheath 175. The plasma center region is the remaining region, other than the plasma edge region, within the plasma region. The top sheath 173 represents a top boundary of the plasma within the plasma edge region and the top boundary is adjacent to the upper electrode extension 116. Moreover, the bottom sheath 175 represents a bottom boundary of the plasma within the plasma edge region and the bottom boundary is adjacent to the lower electrode extension 118. The potentials of top sheath 173 and bottom sheath 175 are defined by process parameters such as pressure of plasma within the plasma edge region, plasma density of the plasma, applied RF voltage, etc. A grounded housing 143 of the processing vacuum chamber 141 is separated from the bottom electrode 108 by an insulating ring 95.

Any neutral gas in the plasma region escapes through slots 145 in C-shroud 125 to the region 147 of the processing vacuum chamber 141 between sidewall 139 and C-shroud 125 and is pumped from the region 147 by a vacuum pump 151 through the slots 145. In one embodiment, the insulator 149 is located between the grounded housing 143 and the lower electrode extension 118.

In some embodiments, the top electrode assembly 105, the one or more insulating rings 112, the upper electrode extension assembly 129, the one or more insulating rings 97, the C-shroud 125, the bottom electrode 108, the one or more coupling rings 114, the lower electrode extension 118, the insulator 149, and the electrically insulating ring 95 are coaxial with a center axis 135 that passes through a center of the electrodes 104 and 108. In various embodiments, the one or more insulating rings 112, the upper electrode extension assembly 129, the one or more insulating rings 97, the C-shroud 125, the bottom electrode 108, the one or more coupling rings 114, the lower electrode extension 118, the insulator 149, and/or the electrically insulating ring 95 are non-coaxial with the center axis 135.

When the electric field 106 is generated and the gas is supplied from the gas source 103 to the plasma region, the gas is electrically excited by the electric field 106 to generate plasma within the plasma region. In one embodiment, the gas is electrically excited by the electric field 106 to ionize the gas.

A control circuit 124, shown in FIG. 1B, is coupled via a coupling 166 to the upper electrode extension 116. In some embodiments, a coupling, as used herein, is a metal conductor, such as a metal wire. In various embodiments, a coupling is a combination of a metal wire and one or more metal conductors, such as a plate, a rod, a conduit, or a hub. In some embodiments, a coupling is a metal conductor.

A passage 183 is formed through a portion, such as the metal layer 137, the second layer 133A, and the first layer 131A, of the processing vacuum chamber 141 to insert the coupling 166 into the passage 183. In some embodiments, the passage 183 is formed by a hole-forming tool, such as a drill. In one embodiment, a small hole electric discharge machine (EDM) drill is used as a hole-forming tool. The passage 183 is surrounded by a wall 191 formed by the metal layer 137, the first layer 131A and the second layer 133A. In some embodiments, a space or space filled with dielectric material is formed between the coupling 166 and the wall 191. For example, the passage 183 is filled with a dielectric material, such as quartz or aluminum nitride, to insulate the coupling 166 from the metal layer 137, the first layer 131A, and the second layer 133A.

Moreover, in some embodiments, the control circuit 124 is coupled via a coupling 195 to the top electrode 104. In one embodiment, a passage 199 is formed through a portion, such as the metal layer 137, the first layer 119 and the second layer 121, of the processing vacuum chamber 141 to insert the coupling 195 into the passage 199. The passage 199 is formed in the same or similar manner in which the passage 183 is formed. For example, the passage 199 is formed by a hole-forming tool. The passage 199 is surrounded by a wall 197 formed by a combination of the metal layer 137, the first layer 119 and the second layer 121.

In some embodiments, a space or a space filled with a dielectric material is formed between the coupling 195 and the wall 197. For example, the passage 199 is filled with a dielectric material, such as quartz or aluminum nitride, to insulate the coupling 195 from the metal layer 137 and from layers 119 and 121.

In some embodiments, the controller 107 controls the control circuit 124. For example, the controller 107 sends a signal indicating an RF frequency at which the control circuit 124 is to operate. As another example, the controller 107 sends a signal indicating a capacitance of the control circuit 124. As yet another example, the controller 107 sends a signal indicating an inductance of the control circuit 124. As another example, the controller 107 sends a signal indicating a voltage amplitude of an RF signal to the control circuit 124. In one embodiment, the controller 107 is decoupled from the control circuit 124 and various parameters, such as a capacitance, a voltage of an RF signal, an inductance, and/or a frequency, of the control circuit 124 are controlled manually by a user.

The control circuit 124 provides an RF signal 126 that is sent via the coupling 166 to the upper electrode extension 116. The RF signal 126 has a frequency and a voltage amplitude. Upon receiving the RF signal 126, a frequency and a voltage amplitude of the top sheath 173 is varied. For example, the top sheath 173 has the same frequency as that of the RF signal 126. As another example, the top sheath 173 has the same voltage amplitude as that of the RF signal 126. As yet another example, the top sheath 173 has a similar frequency as that of the RF signal 126, such as within a variance of the frequency of the RF signal.

Moreover, in some embodiments, the application of the RF signal 126 results in a change in density of plasma within the plasma edge region. For example, the change in a voltage amplitude of the RF signal 126 that is received at the top sheath 173 via the upper electrode extension 116 results in a change in density of plasma within the plasma edge region. Similarly, in some embodiments, the application of the RF signals 126 and 155 results in a change in plasma density ratio, which is a ratio of density of plasma within the plasma center region and density of plasma within the plasma edge region.

Figure 2:
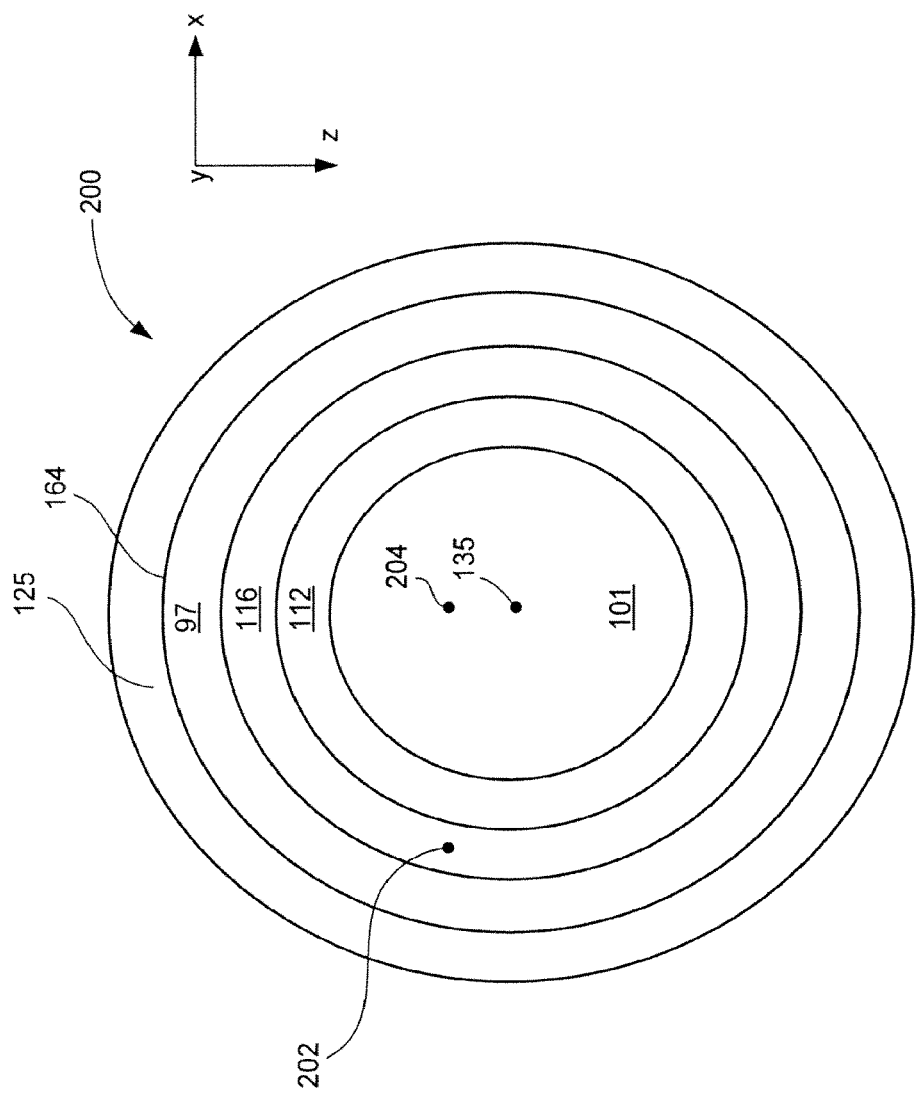
FIG. 2 is a top view of a system for controlling a voltage of an RF signal that is provided to a top sheath of a portion of the plasma, in accordance with one embodiment of the present invention.

FIG. 2 is a top view of an embodiment of a system 200 for controlling a frequency of the top sheath 173. A point 202 on a top surface of the upper electrode extension 116 is a point to which the coupling 166 is coupled. Moreover, a point 204 is a point on a top surface of the gas distribution plate 101 to which the coupling 195 is coupled. It should be noted that the top electrode 104 is circular in shape, the gas distribution plate 101 is also circular in shape, and the upper electrode extension 116 has a ring shape. In one embodiment, the upper electrode extension 116 includes any number of concentric rings. In some embodiments, the top electrode 104 or gas distribution plate 101 is of a different shape, such as oval or polygonal. In one embodiment, the gas distribution plate 101 or top electrode 104 includes multiple concentric rings with an independent RF source for each concentric ring. In this embodiment, an RF source provides an RF signal to a concentric ring of the gas distribution plate 101 to control plasma density. Moreover, in this embodiment, the RF sources independently provide RF signals to the respective concentric rings of the gas distribution plate 101 to facilitate achieving plasma density uniformity in the plasma center region. Moreover, in various embodiments, the upper electrode extension 116 is of a different shape, such as a shape having a polygonal cross-section or a shape having an oval cross-section. Also, in various embodiments, although an annular shape of the C-shroud 125 is shown, in some embodiments, the C-shroud 125 is of a different shape, such as a shape having a polygonal cross-section or a shape having an oval cross-section.

It should be noted that in some embodiments, the coupling 166 is coupled with any point on the top surface of the upper electrode extension 116. Moreover, in one embodiment, the coupling 195 is coupled with any point on the top surface of the gas distribution plate 101.

Figure 3:
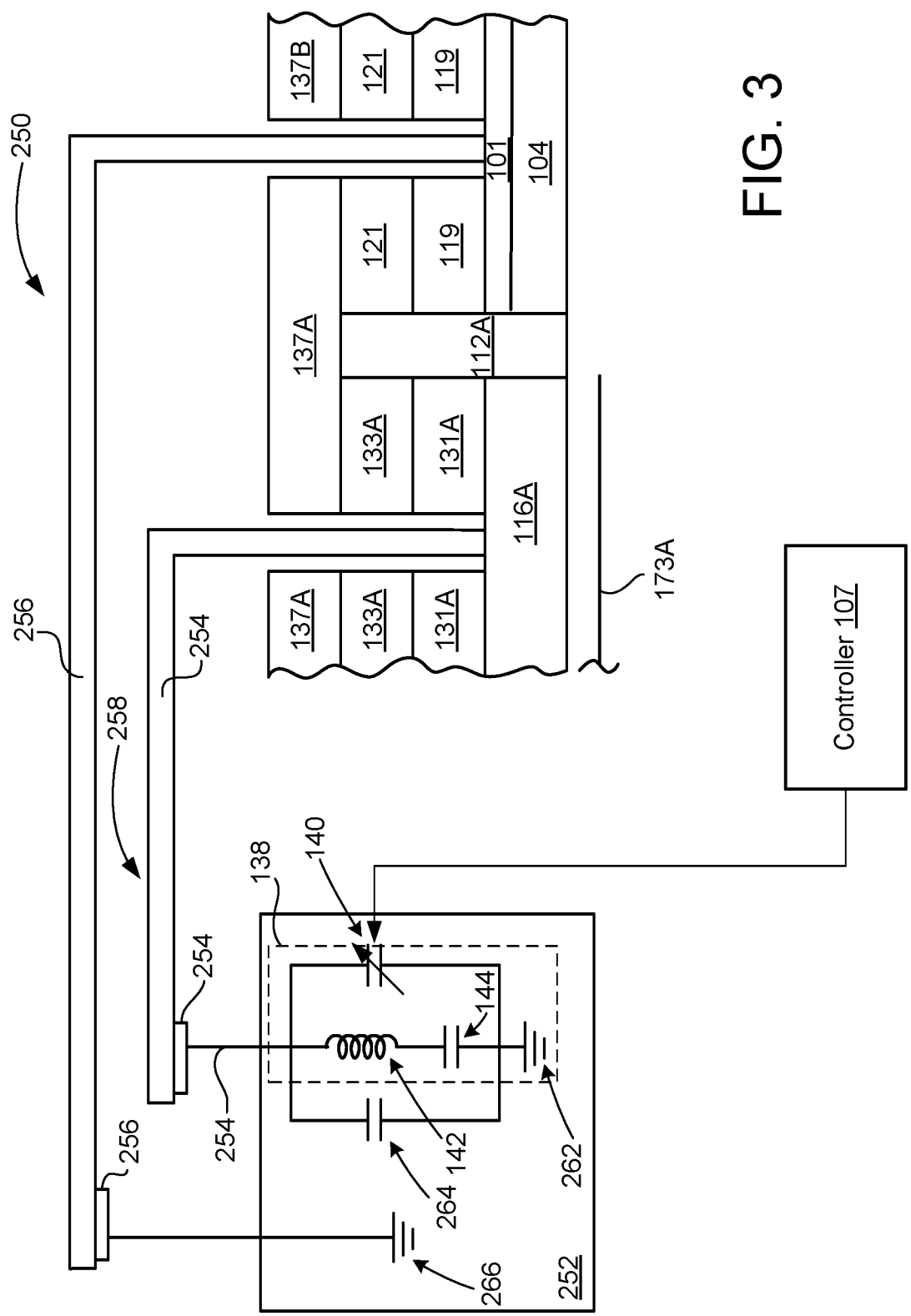
FIG. 3 is a close-up view of a portion of the system, of FIG. 1, that includes a control circuit, in accordance with one embodiment of the present invention.

FIG. 3 is a close-up view of an embodiment of a system 250 that includes a control circuit 252, which is an example of the control circuit 124 (FIG. 1). An RF filter 138 of the control circuit 252 is coupled with the upper electrode extension 116 via a coupling 254, which is an example of the coupling 166 (FIG. 1). Moreover, the top electrode 104 is coupled with ground 266 via a coupling 256, which is an example of the coupling 195 (FIG. 1).

The RF filter 138 includes a variable capacitor 140 and an inductor 142. In some embodiments, a capacitance of the variable capacitor 140 ranges from 7 picoFarads (pF) to 1453 pF. In several embodiments, an inductance of the inductor is 142 is fixed at 4 microHenry (μH). In one embodiment, an inductance of the inductor 142 is fixed at approximately 4 μH. Moreover, the variable capacitor 140 and the inductor 142 are coupled with ground 262.

In one embodiment in which a blocking capacitor 144 is excluded from the RF filter 138, the variable capacitor 140 is coupled in parallel with the inductor 142. The blocking capacitor 144 blocks, such as filters, a DC from being conducted through the coupling 254. In one embodiment, the blocking capacitor 144 is coupled in series with the inductor 142. In some embodiments, the blocking capacitor 144 has a capacitance of 9.2 nanoFarads (nF). In various embodiments, the blocking capacitor 144 has a capacitance of approximately 9.2 nF. In some embodiments, an approximation of a magnitude of a parameter, such as capacitance or inductance, is a range that ranges from a difference between the magnitude and the variance to a sum of the magnitude and the variance. For example, if a magnitude of capacitance is 9.2 nF and a variance of the magnitude is 0.2 nF, approximately 9.2 nF means that the magnitude ranges from 9 nF to 9.4 nF.

In one embodiment, a capacitance of the variable capacitor 140 is varied to change a voltage amplitude of an RF signal 258, which is an example of the RF signal 126 (FIG.

1). The RF signal 258 is provided from the RF filter 138. In one embodiment, an inductance of the variable inductor is varied to change a frequency and/or a voltage amplitude of the RF signal 258. An internal, or stray, capacitance 264 of the coupling 254 is shown. In some embodiments, the control circuit 252 excludes the internal capacitance 264. A stray capacitance of a circuit component, such as a capacitor or an inductor, is a capacitance that is experienced by the circuit component as a result of other circuit components.

Figure 4:
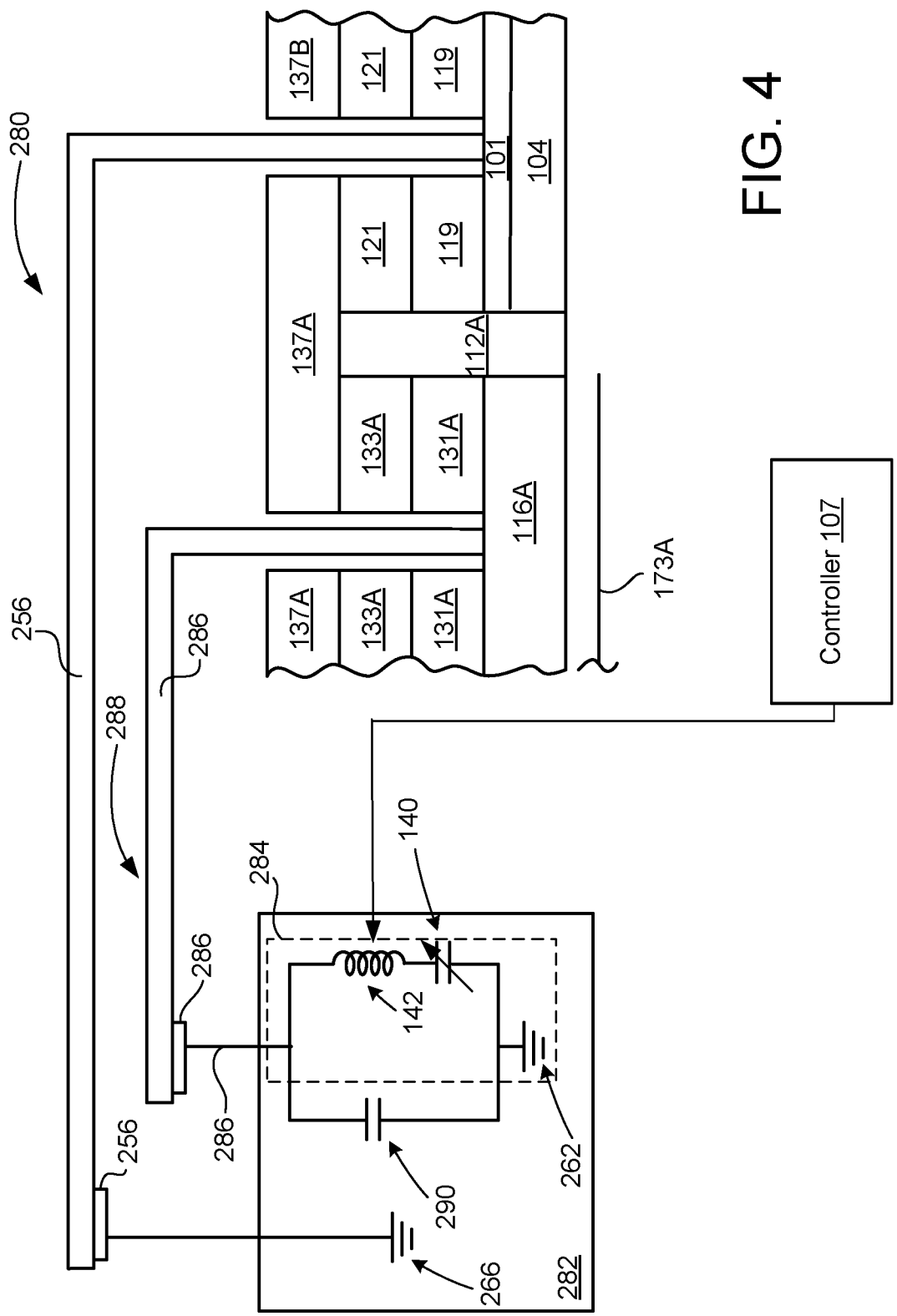
FIG. 4 is a close-up view of a portion of the system, of FIG. 1, that includes a control circuit, in accordance with another embodiment of the present invention.

FIG. 4 is a close-up view of an embodiment of a system 280 that includes a control circuit 282, which is an example of the control circuit 124 (FIG. 1). The control circuit 282 includes an RF filter 284. The RF filter 284 is coupled with the upper electrode extension 116 via a coupling 286, which is an example of the coupling 166 (FIG. 1). The RF filter 284 includes the inductor 142 and the variable capacitor 140.

The variable capacitor 140 coupled in series with the inductor 142. Moreover, the variable capacitor 140 and the inductor 142 are coupled with ground 262.

In one embodiment, a capacitance of the variable capacitor 140 is varied to change an amplitude of an RF signal 288, which is an example of the RF signal 126 (FIG. 1). The RF signal 288 applied at the upper electrode extension 116 is controlled by the RF filter 284. In one embodiment, an inductance of a variable inductor, used instead of the inductor 142, is varied to change a frequency and/or amplitude of the RF signal 288. An internal, or stray, capacitance 290 of the coupling 286 is shown. In some embodiments, the control circuit 282 excludes the internal capacitance 290.

With reference to FIGS. 3 and 4, in some embodiments, a capacitor with fixed capacitance is used instead of the variable capacitor 140. In these embodiments, a user replaces one capacitor with another capacitor to change a value of the capacitance of the fixed capacitor. In one embodiment, a capacitance of the variable capacitor 140 is changed by the controller 107 (FIG. 1), which sends a signal to a motor (not shown). The motor operates in response to receiving the signal to change a distance between plates of the variable capacitor 140 to change a capacitance of the variable capacitor 140.

With continued reference to FIGS. 3 and 4, in one embodiment, a variable inductor with a variable inductance is used instead of the inductor 142. In some embodiments, an inductance of the variable inductor is changed by the controller 107, which sends a signal to a motor (not shown). In these embodiments, the motor operates in response to receiving the signal to change a length of the variable inductor to change an inductance of the variable inductor. In one embodiment, a user replaces the inductor 142 with another inductor to change a value of the inductance of the variable inductor.

Figure 5:
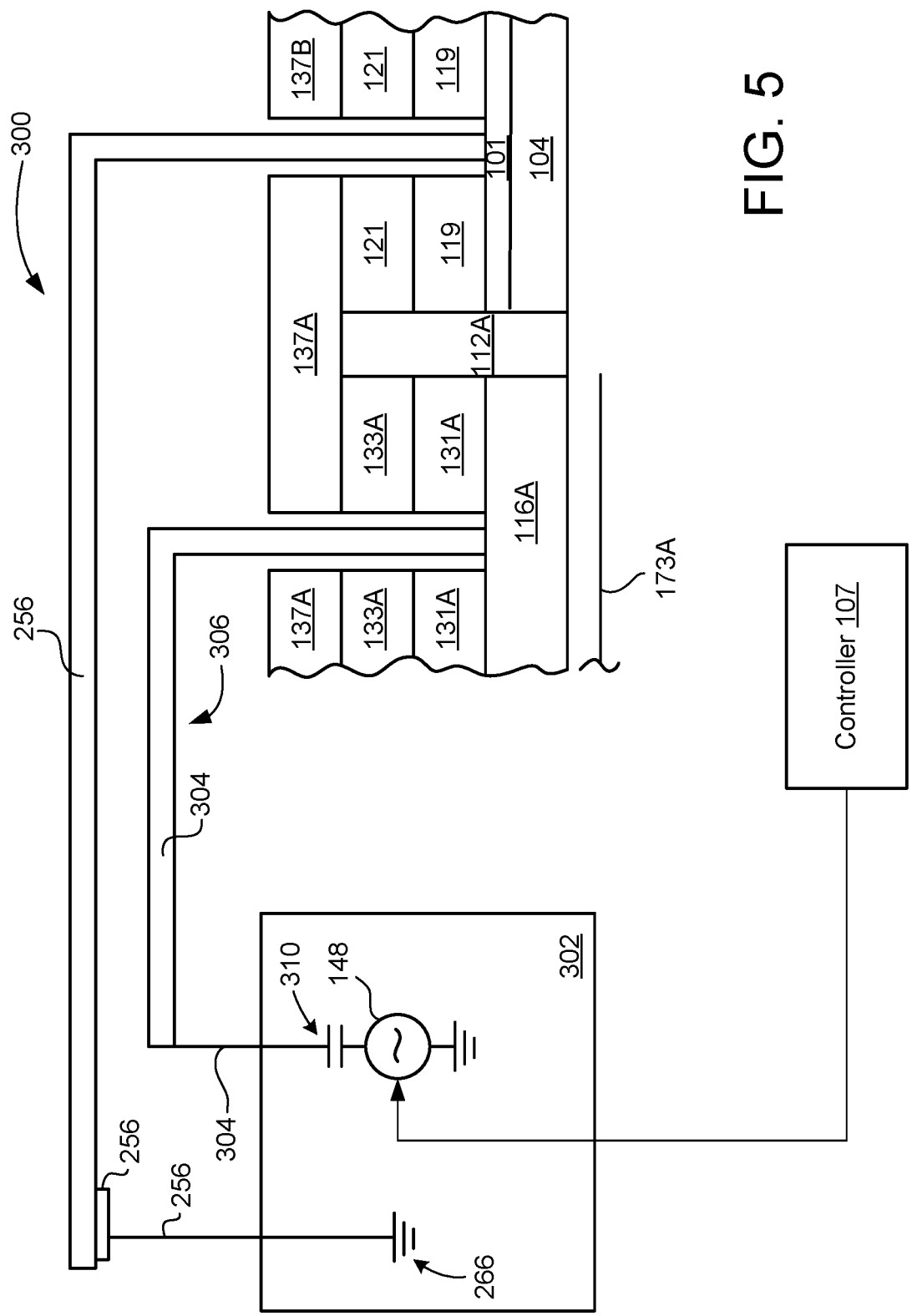
FIG. 5 is a close-up view of a portion of the system, of FIG. 1, that includes a control circuit, in accordance with still another embodiment of the present invention.

FIG. 5 is a close-up view of an embodiment of a system 300 that includes a control circuit 302, which is an example of the control circuit 124 (FIG. 1). An RF source 148 of the control circuit 302 is coupled with the upper electrode extension 116 via a coupling 304, which is an example of the coupling 166 (FIG. 1). Moreover, the top electrode 104 is coupled with ground 266 via the coupling 256 and the gas distribution plate 101.

In one embodiment, a RF power of the RF source 148 is varied to change a voltage of an RF signal 306, which is an example of the RF signal 126 (FIG. 1). The RF signal 306 is generated by the RF source 148. In some embodiments, a radio frequency of operation of the RF source 148 is 400 kHz or 2 MHz, and is not limited to these driving frequency values In several embodiments, RF power of the RF source 148 is changed by the controller 107. In these embodiments, the controller 107 sends a signal indicating a voltage amplitude of the RF signal 306 to the RF source 148, which generates and sends the RF signal 306 with the voltage amplitude to the upper electrode extension 116. In one embodiment, power of the RF source 148 is changed manually by a user.

A matching network 310 is tuned to facilitate a match between an impedance of the RF source 148 and an impedance of a first load. In some embodiments, the first load includes the upper electrode extension 116 and plasma. In one embodiment, an impedance of the first load is an impedance of a portion of the plasma processing vacuum chamber 141 as seen by the RF source 148. An example of impedance match is provided in U.S. Pat. No. 5,889,252, which is incorporated by reference herein in its entirety. Another example of impedance match is provided in U.S. Pat. No. 5,689,215, which is incorporated by reference herein in its entirety.

Figure 6:
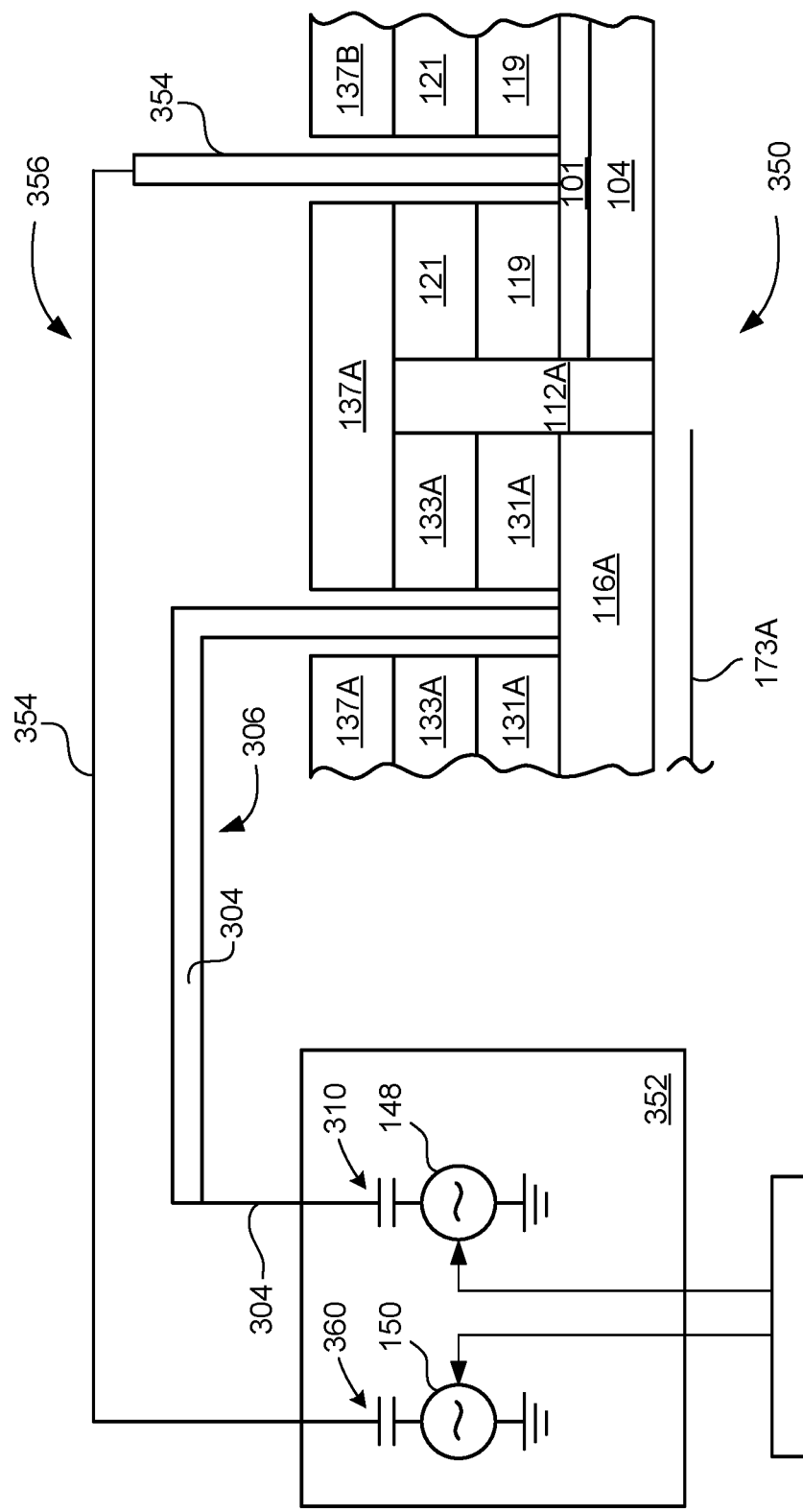
FIG. 6 is a close-up view of a portion of the system, of FIG. 1, that includes a control circuit, in accordance with yet another embodiment of the present invention.

FIG. 6 is a close-up view of an embodiment of a system 350 that includes a control circuit 352, which is an example of the control circuit 124 (FIG. 1). An RF source 150 of the control circuit 302 is coupled with the gas distribution plate 101 via a coupling 354, which is an example of the coupling 195 (FIG. 1). In some embodiments, a radio frequency of operation of the RF source 150 is 400 kHz or 2 MHz, and is not limited to these driving frequency values. Moreover, the upper electrode extension 116 is coupled with the RF source 148, as is shown in FIG. 4.

In one embodiment, a radio frequency of the RF source 150 is varied to change a frequency of an RF signal 356, which is an example of the RF signal 155 (FIG. 1). In some embodiments, a voltage amplitude of the RF source 150 is varied to change an amplitude of the RF signal 356. The RF source 150 generates the RF signal 155.

In some embodiments, the radio frequency and/or amplitude of the RF source 150 is changed by the controller 107. In these embodiments, the controller 107 sends a signal indicating a voltage amplitude to the RF source 150, which generates and sends the RF signal 356 with the voltage amplitude to the top electrode 104. In one embodiment, the power of the RF source 150 is changed manually by a user.

A matching network 360 is tuned to facilitate a match between an impedance of the RF source 150 and an impedance of a second load. In some embodiments, the second load includes a combination of the gas distribution plate 101, the top electrode 104, and plasma. In one embodiment, an impedance of the second load is an impedance of a portion of the plasma processing vacuum chamber 141 as seen by the RF source 150.

Figure 7:
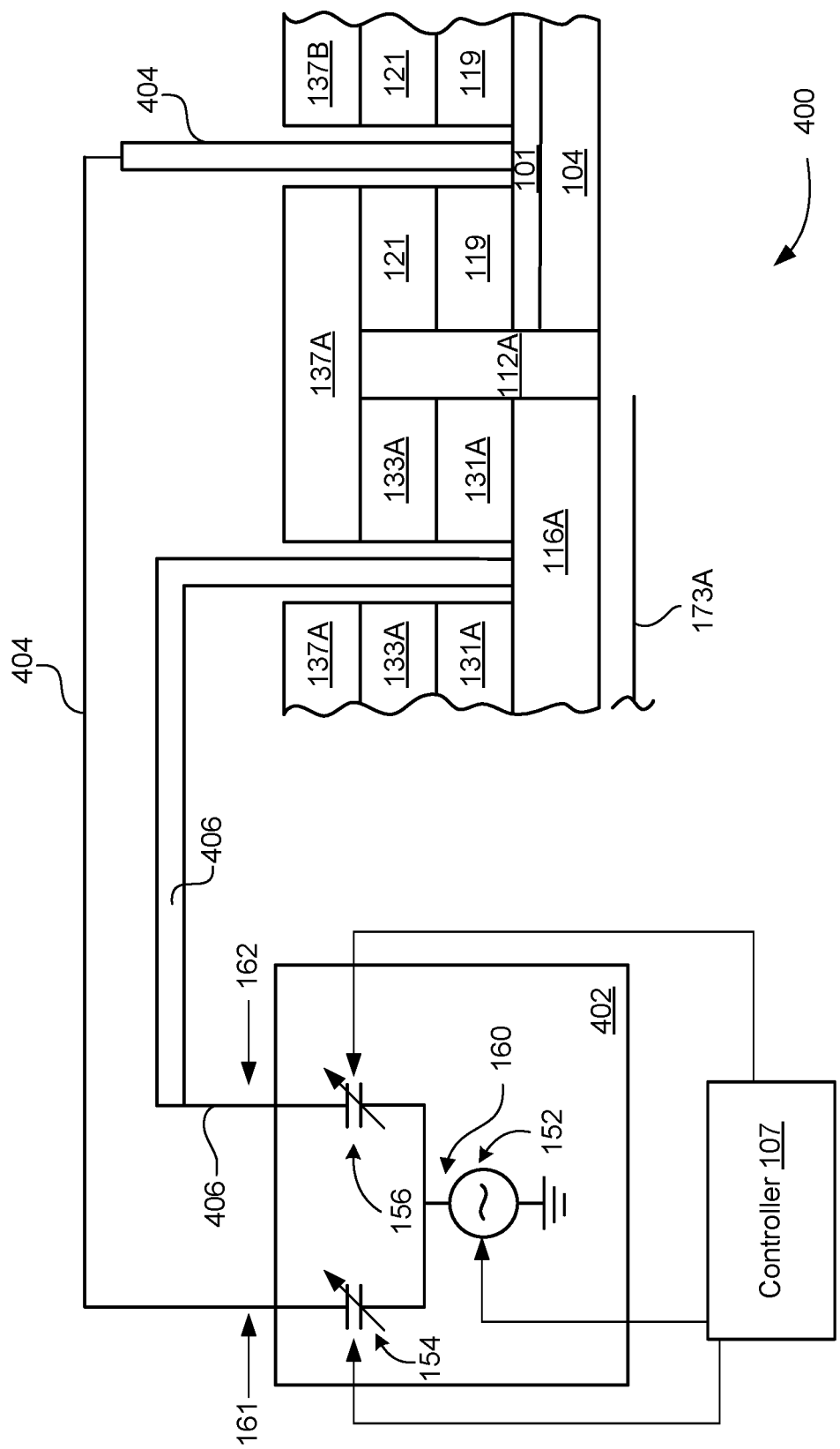
FIG. 7 is a close-up view of a portion of the system, of FIG. 1, that includes a control circuit, in accordance with another embodiment of the present invention.

FIG. 7 is a close-up view of an embodiment of a system 400 that includes a control circuit 402, which is an example of the control circuit 124 (FIG. 1). An RF source 152 of the control circuit 402 is coupled with the gas distribution plate 101 via a coupling 404, which is an example of the coupling 195 (FIG. 1). In one embodiment, the frequency of operation of the RF source 152 is 400 kHz or 2 MHz, and is not limited to these driving frequency values. Moreover, the RF source 152 is coupled with the upper electrode extension 116 via a coupling 406, which is an example of the coupling 166 (FIG. 1).

The RF source 152 generates an RF signal 160, which is split into two RF signals 161 and 162 after the RF signal 160 passes through voltage control circuits 154 and 156, which are schematically shown as variable capacitors. The signal 161 is an example of the RF signal RF signal 155 (FIG. 1) and the signal 162 is an example of the RF signal 126 (FIG. 1).

In one embodiment, a radio frequency of the RF source 152 is varied to change a frequency of the RF signal 160, which in effect changes frequencies of the RF signals 161 and 162. In one embodiment, an amplitude of the RF source 152 is varied to change an amplitude of the RF signal 160, which in effect changes amplitudes of the RF signals 161 and 162.

It should be noted that a capacitor and an inductor are passive components and an RF source is an active component. In one embodiment, a passive component consumes but does not produce energy. In some embodiments, an active component produces energy.

It is noted that sometimes, as used herein, A and B are part of the same structure. For example, the part 118A and the part 118B are parts of the lower electrode extension 118. As another example, the part 116A and the part 116B are parts of the upper electrode extension 116.

Figure 8:
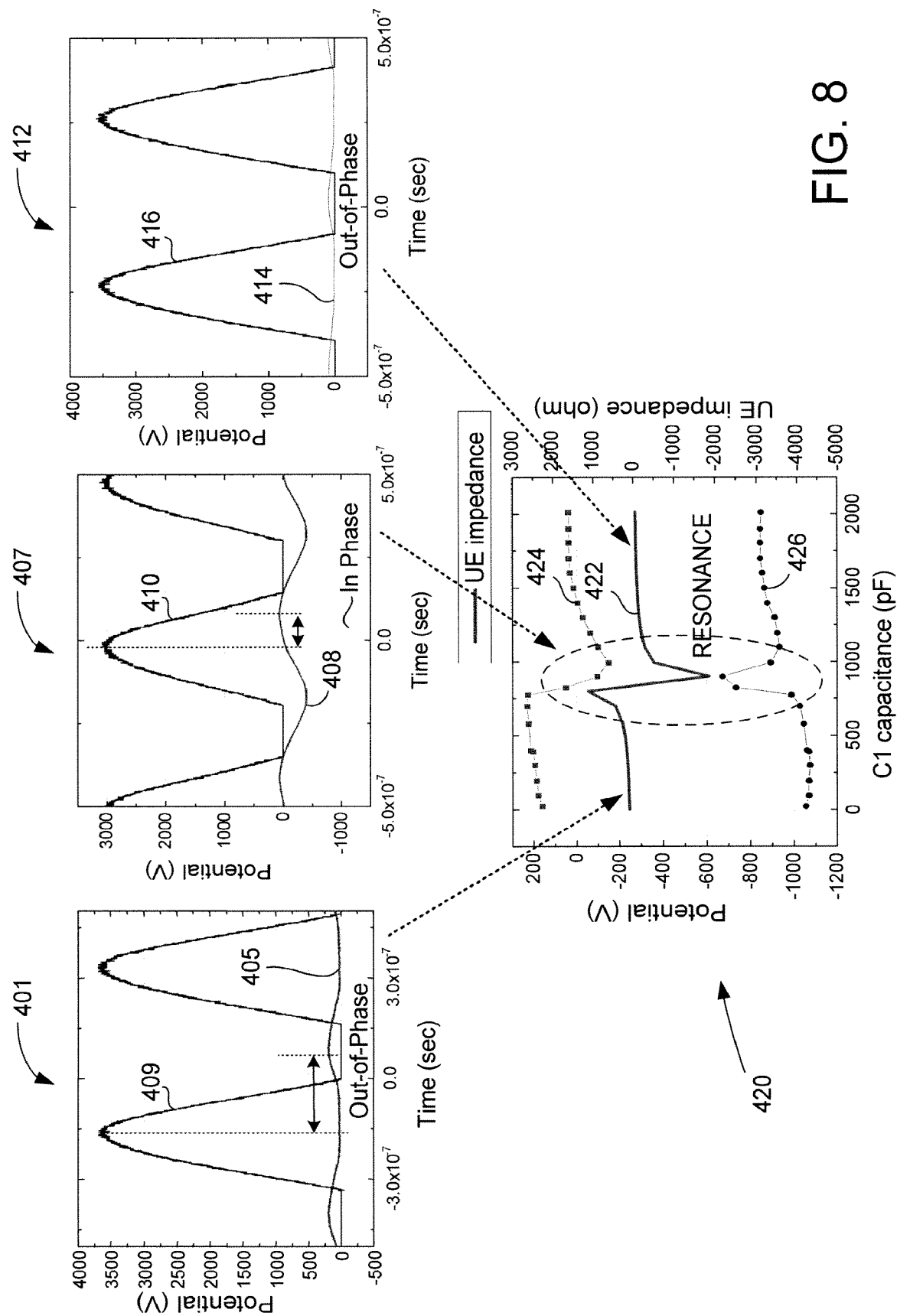
FIG. 8 shows various graphs illustrating phase locking between and phase difference in phases of RF signals received at electrodes similar to upper and lower electrode extensions and illustrating a change in a voltage amplitude of an RF signal received at a top sheath with a change in the capacitance, in accordance with another embodiment of the present invention.

FIG. 8 shows various graphs illustrating phase locking between and phase difference in phases of RF signals received at electrodes similar to upper and lower electrode extensions 116 and 118 and illustrating a change in a voltage amplitude of the RF signal 126 received at a top sheath with a change in a capacitance C1. In one embodiment, the capacitance C1 is of the capacitor 140 (FIGS. 3 & 4). In some embodiments, the capacitance C1 is of the control circuit 124 (FIG. 1).

Graph 401 shows an RF signal 405 measured at an upper electrode, similar to the upper electrode extension 116, as a function of time. Moreover, graph 401 shows an RF signal 409, which is a measurement of a plasma sheath voltage at a lower electrode, similar to the lower electrode extension 118, as a function of time. It is noted that the RF signals 405 and 409 are out of phase. The frequency and the amplitudes, shown in the graph 401, of the RF signal 405 are generated when the capacitance C1 is within a first range, such as between 0 and approximately 650 pF.

Furthermore, graph 407 shows an RF signal 408 measured at the upper electrode as a function of time. Moreover, graph 407 shows an RF signal 410, which is a measurement of a plasma sheath voltage at the lower electrode as a function of time. It is noted that the RF signals 408 and 410 are close to an in-phase or a phase-locked condition. When the RF signals 408 and 410 are in phase, electrons are trapped within the plasma in the plasma edge region formed between the upper electrode extension 116 and the lower electrode extension 118. The trapping of the electrons results in an increase in density of the plasma within the plasma edge region. The in phase condition and the amplitudes, shown in the graph 407, of the RF signal 408 are generated when capacitance of the capacitance C1 is within a second range, such as between approximately 650 pF and approximately 1200 pF.

Moreover, graph 412 shows an RF signal 414 measured at the upper electrode as a function of time. Moreover, graph 412 shows an RF signal 416, which is a measurement of a plasma sheath voltage at the lower electrode as a function of time. It is noted that the RF signals 414 and 416 are out of phase. The frequency and the amplitudes, shown in the graph 412, of the RF signal 414 are generated when the capacitance C1 is within a third range, such as between approximately 1200 pF and approximately 2000 pF. In one embodiment, the third range is higher than the second range, which is higher than the first range. Moreover, the RF signals 405, 408, and 414 are examples of the RF signal 126 (FIG. 1).

A graph 420 plots an impedance 422, measured in ohm, of the upper electrode. Graph 420 also shows a change in an DC bias voltage 426 measured at the lower electrode. Graph 420 shows a change in DC bias voltage 424 measured at the upper electrode. It is noted that the change in impedance 422 is similar to that of the change in the DC bias voltage 424. Accordingly, by changing a capacitance of the control circuit 124 (FIG. 1), a frequency and/or amplitude of the RF signal 126 is changed, and the change in the amplitude and/or condition, such as in-phase or out-of-phase, of the RF signal 126 results in a change in phase and/or frequency of the top sheath 173. Similarly, by changing an inductance of the control circuit 124 (FIG. 1), a frequency and/or amplitude of the RF signal 126 is changed, and the change in the amplitude and/or condition, such as in-phase or out-of-phase, of the RF signal 126 results in a change in phase and/or frequency of the top sheath 173.

Figure 9:
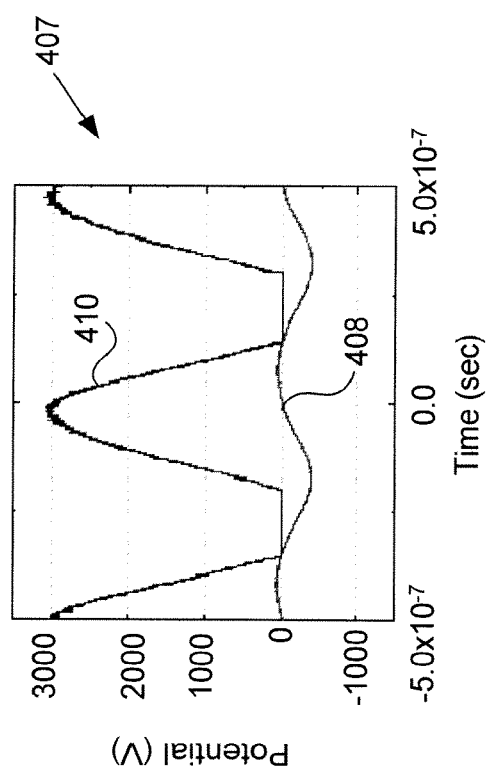
FIG. 9 shows various graphs illustrating a movement of electrons between the upper electrode extension and a lower electrode extension when RF signals applied to the upper electrode extension and the lower electrode extension are in phase, in accordance with another embodiment of the present invention.
Figure 9:
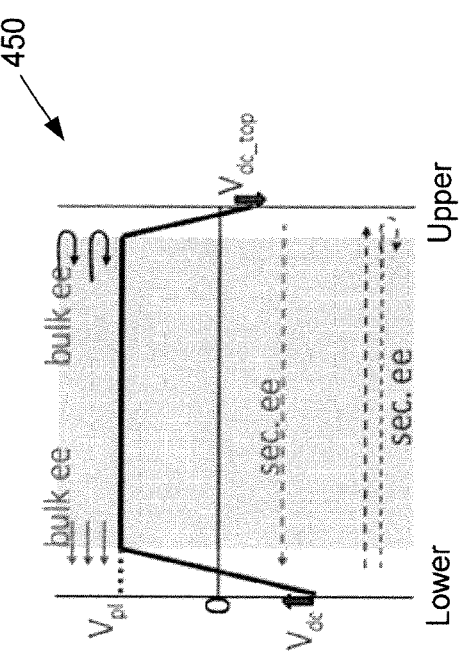

FIG. 9 shows various graphs illustrating a movement of electrons between the upper electrode extension 116 and the lower electrode extension 118 when the RF signals 408 and 410 are in phase. When the RF signals 408 and 410 are in phase, as shown in a graph 450, bulk electrons are reflected from the top sheath 173 back into the plasma in the plasma edge region to increase a density of the plasma. The reflection of the bulk electrons results in an increase in ionization within the plasma of the plasma edge region.

Moreover, when the RF signals 408 and 410 are in phase, the secondary electrons produced at the bottom sheath 175 are also become trapped in the plasma bulk The travel of the secondary electrons from the bottom sheath 175 to the top sheath 173 and the reflection from the top sheath 173 results in an increase in ionization within the plasma in the plasma edge region.

Also, there is an increase in secondary electrons produced at top sheath 173 due to a higher amplitude of the top sheath 173 than that of the bottom sheath 175. The increase in secondary electrons at the top sheath 173 results in an increase in ionization within the plasma in the plasma edge region.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations, which fall within the scope of the included claims. All matters hitherto fore set forth herein or shown in the accompanying drawings are to be interpreted in an illustrative and non-limiting sense.

What is claimed is:

1. A system for controlling a plasma edge region, comprising:
 a radio frequency (RF) power source configured to generate a first RF signal;
 a plasma chamber including:
  a top electrode;
  a bottom electrode situated below the top electrode and coupled to the RF power source for receiving the first RF signal;
  one or more upper insulating rings surrounding a portion of the top electrode;
  a lower insulating ring surrounding a portion of the bottom electrode;
  an upper electrode extension surrounding a portion of the one or more upper insulating rings;

a lower electrode extension surrounding a portion of the lower insulating ring, wherein at least a portion of a plasma center region is formed between the top electrode and the bottom electrode, wherein at least a portion of the plasma edge region is formed between the upper electrode extension and the lower electrode extension; and a control circuit having an active component coupled to the upper electrode extension, wherein the active component is configured to generate a second RF signal to provide to the upper electrode extension; and a controller coupled to the active component and the RF power source to control amplitudes of the first and second RF signals to match a phase of a voltage at the upper electrode extension with a phase of a voltage that is applied from the bottom electrode via the lower insulating ring to the lower electrode extension.

2. The system of claim 1, wherein the active component is a radio frequency source that is coupled to the upper electrode extension via a matching network, wherein the top electrode is coupled to ground.

3. The system of claim 1, wherein the active component is a radio frequency source that is coupled to the upper electrode extension via a matching network and a coupling, wherein the top electrode is coupled to ground.

4. The system of claim 3, wherein the matching network is configured to match an impedance of the radio frequency source with an impedance of the upper electrode extension and plasma.

5. The system of claim 1, wherein the active component is a radio frequency source.

6. The system of claim 1, wherein the plasma chamber includes:
a top cover;
a first layer located above and next to the upper electrode extension;
a second layer located above and next to the first layer, wherein the active component is coupled to the upper electrode extension via a capacitor and a coupling, wherein the coupling extends via a passage formed within the top cover, the first layer, and the second layer to couple to the upper electrode extension.

7. The system of claim 6, wherein the first layer is fabricated from dielectric, and the second layer includes a heater.

8. The system of claim 6, wherein the passage is filled with a dielectric material to insulate the coupling from the second layer.

9. The system of claim 1, wherein the plasma chamber includes:
a top cover;
a gas distribution plate located above and next to the top electrode;
a first layer located above and next to the gas distribution plate;
a second layer located above and next to the first layer, wherein the top electrode is coupled to a ground potential via a coupling, wherein the coupling extends via a passage formed within the top cover, the first layer, and the second layer to couple to the top electrode.

10. The system of claim 9, wherein the first layer is fabricated from dielectric, and the second layer includes a heater.

11. The system of claim 9, wherein the passage is filled with a dielectric material to insulate the coupling from the second layer.

12. The system of claim 1, wherein the control circuit includes a ground connection, wherein the top electrode is coupled to the ground connection.

13. A system for controlling a plasma edge region, comprising:
a control circuit having an active component coupled to an upper electrode extension, wherein the active component is configured to generate a first radio frequency (RF) signal to apply to the upper electrode extension that surrounds a top electrode of a plasma chamber, wherein the plasma edge region is formed between the upper electrode extension and a lower electrode extension of the plasma chamber, wherein the lower electrode extension surrounds a chuck that is coupled to an RF power source for receiving a second RF signal from the RF power source; and
a controller coupled to the active component and the RF power source to control amplitudes of the first and second RF signals to match a phase of a voltage at the upper electrode extension with a phase of a voltage that is applied from the chuck via a lower insulating ring to the lower electrode extension, wherein the lower insulating ring is located between the lower electrode extension and the chuck of the plasma chamber.

14. The system of claim 13, wherein the active component is a radio frequency source coupled to the upper electrode extension via a matching network for applying the first RF signal to the upper electrode extension via the matching network, wherein the top electrode is coupled to ground.

15. The system of claim 13, wherein the upper electrode extension is located below and next to a first layer, wherein the first layer is located below and next to a second layer, wherein the second layer is located next to and below a top cover of the plasma chamber, wherein the active component is coupled to the upper electrode extension via a capacitor and a coupling, wherein the coupling extends via a passage formed within the top cover, the first layer, and the second layer to couple to the upper electrode extension.

16. The system of claim 15, wherein the first layer is fabricated from dielectric, and the second layer includes a heater.

17. The system of claim 15, wherein the passage is filled with a dielectric material to insulate the coupling from the second layer.

18. The system of claim 13, wherein the top electrode is located below and next to a gas distribution plate, wherein the gas distribution plate is located next to and below a first layer, wherein the first layer is located below and next to a second layer, wherein the second layer is located below and next to a top cover of the plasma chamber, wherein the top electrode is coupled to a ground potential via a coupling, wherein the coupling extends via the top cover, the first layer, and the second layer to couple to the top electrode.

19. The system of claim 18, wherein the first layer is fabricated from dielectric, and the second layer includes a heater.

* * * * *